United States Patent [19]
Casper et al.

[11] Patent Number: 5,940,320
[45] Date of Patent: Aug. 17, 1999

[54] VOLTAGE COMPENSATING OUTPUT DRIVER CIRCUIT

[75] Inventors: Stephen L. Casper; Joseph C. Sher, both of Boise, Id.

[73] Assignee: Micron Technology, Inc., Boise, Id.

[21] Appl. No.: 09/136,781

[22] Filed: Aug. 19, 1998

Related U.S. Application Data

[63] Continuation of application No. 08/848,122, Apr. 28, 1997, Pat. No. 5,802,009.

[51] Int. Cl.$^6$ ............................................. G11C 7/00
[52] U.S. Cl. ............................ 365/185.11; 365/185.06
[58] Field of Search ....................... 365/189.11, 189.06, 365/189.05, 230.06; 326/80, 83, 85, 86, 87; 327/262, 538

[56] References Cited

U.S. PATENT DOCUMENTS

| | | | |
|---|---|---|---|
| 5,128,560 | 7/1992 | Chen et al. ............................... | 307/475 |
| 5,162,680 | 11/1992 | Norman et al. ..................... | 365/189.11 |
| 5,220,221 | 6/1993 | Casper ..................................... | 307/530 |
| 5,274,276 | 12/1993 | Casper et al. ........................... | 307/443 |
| 5,278,460 | 1/1994 | Casper .................................. | 307/296.5 |
| 5,331,593 | 7/1994 | Merritt et al. ...................... | 365/189.11 |
| 5,347,179 | 9/1994 | Casper et al. ........................... | 307/451 |
| 5,352,945 | 10/1994 | Casper et al. ........................... | 307/603 |
| 5,361,002 | 11/1994 | Casper ..................................... | 327/530 |
| 5,369,317 | 11/1994 | Casper et al. ............................. | 326/87 |
| 5,381,377 | 1/1995 | Bewick et al. ..................... | 365/230.06 |
| 5,428,310 | 6/1995 | Casper et al. ........................... | 327/262 |
| 5,467,032 | 11/1995 | Lee ........................................... | 326/88 |
| 5,473,263 | 12/1995 | Mahmood ................................. | 326/27 |
| 5,544,110 | 8/1996 | Yuh ......................................... | 365/205 |
| 5,574,390 | 11/1996 | Thomann ................................. | 326/88 |
| 5,578,941 | 11/1996 | Sher et al. ............................... | 326/34 |
| 5,585,740 | 12/1996 | Tipon ....................................... | 326/26 |
| 5,602,783 | 2/1997 | Ong ..................................... | 365/189.11 |
| 5,627,485 | 5/1997 | Casper et al. ........................... | 327/777 |
| 5,703,811 | 12/1997 | Yoo et al. ........................... | 365/189.11 |
| 5,802,009 | 9/1998 | Casper et al. ....................... | 365/230.06 |
| 5,835,449 | 11/1998 | Lee ..................................... | 365/189.11 |
| 5,854,765 | 12/1998 | Shinozaki ........................... | 365/189.11 |

*Primary Examiner*—Tan T. Nguyen
*Attorney, Agent, or Firm*—Schwegman, Lundberg, Woessner & Kluth P.A.

[57] ABSTRACT

An output driver circuit that compensates for variations in supply voltage to provide more consistent switching speed characteristics. In one embodiment, the output driver circuit includes a plurality of pull down devices which are connected in parallel with one another between an output node of the circuit and ground. One of the pull down devices is coupled to a source of a pull down signal to be turned on in response to the pull down signal. The other pull down devices are turned on selectively, depending upon the level of the supply voltage. The lower the supply voltage, the more pull down devices that are turned on. A latch is provided at the input of each of the pull down devices. The result of the selective enabling of the pull down devices is that a more uniform pull down speed is provided for different levels of the supply voltage.

22 Claims, 4 Drawing Sheets

VOLTAGE COMPENSATING OUTPUT DRIVER CIRCUIT

This is a continuation application of U.S. Pat. application Ser. No. 08/848,122, filed on Apr. 28, 1997 now U.S. Pat. No. 5,802,009.

FIELD OF THE INVENTION

The present invention relates to output driver circuits, and more particularly, to an output driver circuit that compensates for variations in supply voltage.

BACKGROUND OF THE INVENTION

Memory devices, such as dynamic random access memory (DRAM) devices, operate in a wide range of operating voltages. Even with a regulated voltage supply, the range of the operating voltages can still be quite large due to the normal fluctuation of the regulated supply voltage. The regulated supply voltage level can also change because of the constantly changing current demand of a DRAM device.

In prior art FIG. 1, a known output driver circuit 10 includes a pull up transistor 11 and a pull down transistor 12 which are connected in series between a supply voltage rail VCCX and ground. The pull up transistor 11 is enabled in response to a logic high level at pull up node 14 to conduct and pull an output node 16 towards the supply voltage VCCX. Similarly, the pull down transistor 12 is enabled in response to a logic high level at a pull down node 18 to conduct and pull the output node 16 toward ground.

The speed at which the pull down transistor 12 pulls down the output node 16 depends upon the power supply voltage. Thus, in conventional output driver circuits, fluctuations in the supply voltage generally result in inconsistent drive which leads to inconsistent speed at which the pull down transistors pull the output down. The lower the supply voltage, the lower the drive, and consequently, the lower the switching speed for the pull down transistors of the output driver circuit.

While one could increase the drive at all supply levels, it would result in significant undesirable ground bounce at high supply levels.

There is a need in the art for an output driver circuit that compensates for variations in supply voltage. There is a further need for an output driver having less speed dependency on the supply voltage.

SUMMARY OF THE INVENTION

An output driver circuit compensates for variations in supply voltage to provide more consistent switching speed characteristics. The output driver circuit includes a plurality of drive devices that are selectively enabled in response to changing supply voltages. In one embodiment, a reference voltage source provides a plurality of voltages that are indicative of the level of the voltage supply. The drive devices are coupled to the reference voltage source to allow selective enabling of the drive devices as a function of the level of the voltage supply.

In one embodiment, the drive devices comprise a pull down device that is enabled whenever a pull down signal is provided and further pull down devices that are enabled to respond to the pull down signal with decreases in the supply voltage. A voltage divider circuit provides voltages at first and second levels, with the voltage levels changing in accordance with changes in the supply voltage. When the supply voltage has decreased to a first lower level relative to a nominal value, a first one of the further pull down devices is enabled to respond to the pull down signal. If the supply voltage decreases further to a second lower level, a second one of the further pull down devices also is enabled to respond to the pull down signal. Thus, the number of pull down devices that are enabled increases as the supply voltage decreases.

The provision of the additional pull down devices results in a more uniform output speed characteristic than is provided when a single pull down driver is used. In yet a further embodiment, more than three pull down devices provide a fairly constant switching speed of the driver circuit. By providing multiple pull down devices, the pull down switching speed of the driver circuit may be maintained without greatly increasing the drive at higher supply voltages which might result in undesirable ground bouncing. Increasing the drive at lower supply voltages does not result in significant ground bounce, but does provide enhanced switching speed.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. Other embodiments may be utilized, and changes may be made without departing from the spirit and scope of the present invention. The following detailed description is, therefore, not to be taken in a limiting sense, and the scope of the present invention is defined only by the appended claims.

Figure 2:
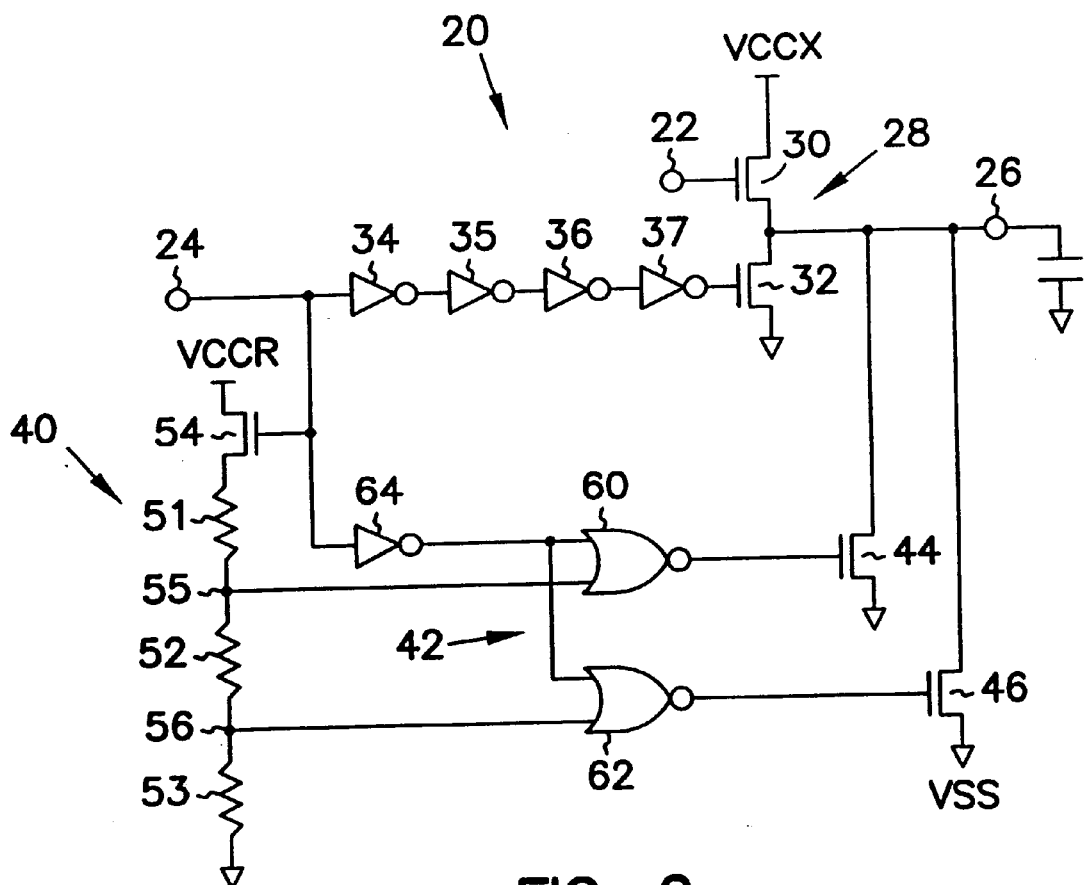
FIG. 2 is a schematic diagram of an output driver circuit in accordance with the present invention.

In FIG. 2, a CMOS output driver circuit is indicated generally at 20. The output driver circuit 20 can be fabricated in any integrated circuit device including, but not limited to, memory devices, such as synchronous or asynchronous dynamic random access memory devices (DRAM), or static random access memory devices, for example. The output driver circuit can be used in any application where it is necessary to rapidly pull a node to the level of a voltage source or ground potential. In the exemplary embodiment, the output driver circuit 20 is employed as a data output driver for driving the data output of a DRAM.

The output driver circuit 20 includes a pull up node 22, a pull down node 24, an output node 26 and a driver stage 28.

The driver stage 28 includes a pull up, n-channel field-effect transistor 30 and a pull down, n-channel field-effect transistor 32. Transistor 30 is connected in series with transistor 32 between a first supply voltage and a second supply voltage. The gate of transistor 30 is connected to the pull up node 22. The pull down node 24 is coupled to the gate of transistor 32 through four series-connected inverters 34–37. In the exemplary embodiment, the first voltage supply or voltage source is a D.C. supply rail VCCX at 7.5 volts. The second voltage supply is a supply rail VSS which is at ground potential.

The output driver circuit 20 further includes a reference voltage source 40, a gating circuit 42, and pull down devices 44 and 46. The pull down devices 44 and 46 are each embodied as n-channel field-effect transistors and are controlled by the reference voltage source to be selectively enabled as a function of the level of the supply voltage VCCR as will be shown.

The reference voltage source 40 includes a voltage divider circuit formed by series-connected resistors 51, 52 and 53, and an n-channel field-effect transistor 54. Transistor 54 is connected in series with the resistors 51–53 between a third voltage source or supply voltage and ground. The gate electrode of transistor 54 is connected to the pull down node 24 for enabling the transistor 54 to conduct whenever the pull down node 24 is at a logic high level. The junction of resistors 51 and 52 defines a first output or node 55 for the voltage divider circuit. The junction of resistors 52 and 53 defines a second output or node 56 for the voltage divider circuit.

In the exemplary embodiment, the third voltage supply is an internal regulated D.C. voltage VCCR at a level of 5 volts that is derived from the supply voltage VCCX. In some embodiments, it may be shorted to VCCX. The voltage divider circuit provides voltages at nodes 55 and 56 that are proportional to the internal regulated supply voltage VCCR and thus are indicative of the level of the supply voltage VCCX. The resistors 51–53 can have the same resistance value, in which case the voltage at node 55 is equal to 2/3 VCCR and the voltage at node 56 is equal to 1/3 VCCR. However, the values of the resistances of resistors 51–53 can be selected to provide any ratio between the voltages at nodes 55 and 56 and the regulated supply voltage VCCR. In the exemplary embodiment, the values of the resistances of resistors 51–53 are selected so that both pull down devices 44 and 46 are maintained nonconducting by gating circuitry 42 when the regulated voltage VCCR is equal to or greater than 5 volts; the pull down device 44 is maintained nonconducting and the pull down device 46 is rendered conducting by the pull down signal when the regulated supply voltage VCCR is somewhere between 2.5 volts and 5 volts; and both of the pull down devices 44 and 46 are enabled to respond to the pull down signal and conduct when the regulated supply voltage is approximately 2.5 volts.

The gating circuit 42 includes NOR gates 60 and 62 and an inverter 64. The pull down node 24 is coupled through inverter 64 to one input of NOR gate 60, a second input of which is connected to the junction of resistors 51 and 52 at node 55. The output of NOR gate 60 is connected to the gate of transistor 44. Transistor 44 is connected between the output node 26 and ground, in shunt with transistor 32.

Similarly, the pull down node is coupled through inverter 64 to one input of NOR gate 62, a second input of which is connected to the junction of resistors 52 and 53 at node 56. The output of NOR gate 62 is connected to the gate of transistor 46. Transistor 46 is connected between the output node 26 and ground, in shunt with transistors 44 and 32.

In operation of the output driver circuit 20, it is assumed that the external supply voltage VCCX initially is at a level of 7.5 volts and that the internal regulated supply voltage VCCR is at a level of 5 volts. When the pull up node 22 is at a logic low level, transistor 30 is off. When the pull up node 22 is at a logic high level, transistor 30 is enabled and couples the supply voltage VCCX to the output node 26, pulling the output node towards the supply voltage VCCX.

When the pull down node 24 is at a logic low level, transistors 32, 44 and 46 are all non-conducting. When the pull down node 24 is at a logic high level, the pull down signal is passed through the series-connected inverters 34–37 to the gate of the transistor 32, causing the transistor 32 to be turned on. In addition, transistor 54 is turned on, coupling the reference supply voltage VCCR to the resistors 51–53 that form the voltage divider circuit so that voltages proportional to the regulated supply voltage VCCR are provided at nodes 55 and 56 of the voltage divider circuit 40. For the condition that the supply voltage VCCX is at 7.5 volts and the regulated supply voltage VCCR is at 5 volts, the voltages provided at nodes 55 and 56 disable NOR gates 60 and 62 so that both transistors 44 and 46 are maintained nonconducting when the pull down signal is provided at the pull down node 24.

Figure 1:
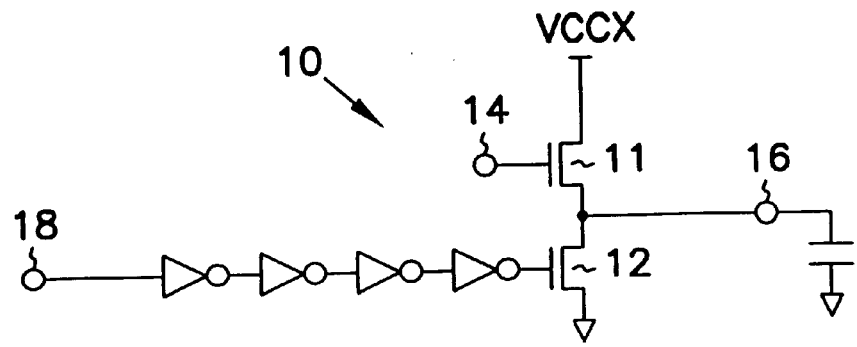
FIG. 1, which is labeled "Prior Art," is a schematic diagram of a known output driver circuit.
Figure 3:
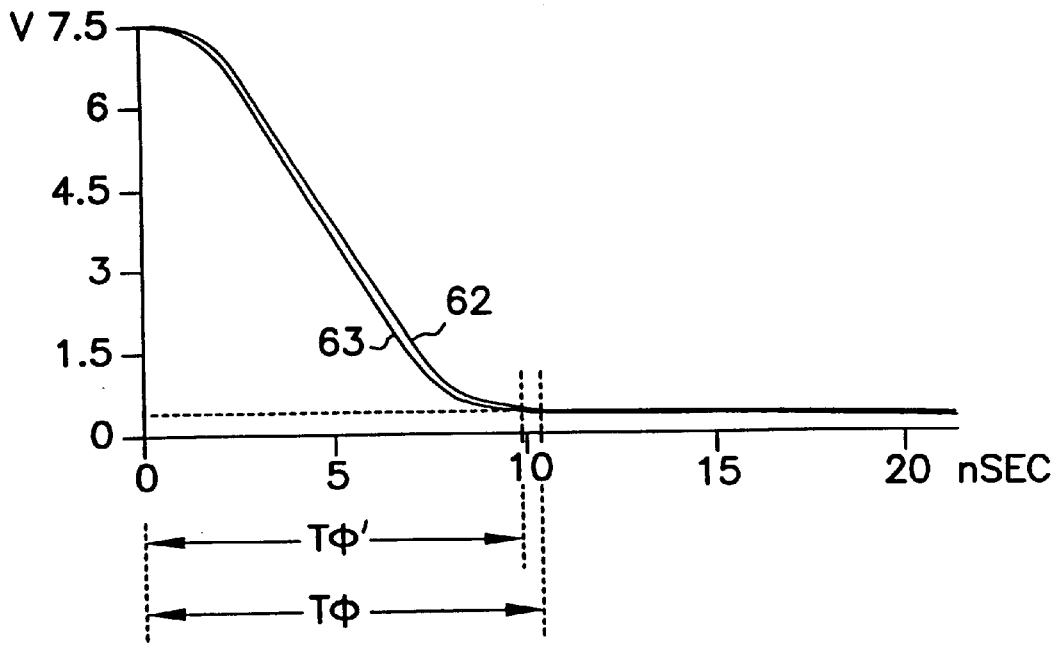
FIG. 3 illustrates the results of a computer simulation comparing the response of the prior art output driver circuit of FIG. 1 with the output driver circuit of FIG. 2 for a supply voltage of 7.5 volts.

Computer simulations were run for comparing the response of the output driver circuit 20 as illustrated in FIG. 2 with the prior art output driver circuit 10 that is shown in FIG. 1. In FIG. 3, Curves 62 and 63 respectively represent the voltages at the output nodes 16 and 26 of the prior art circuit 10 and the current invention 20. For the conditions of a supply voltage VCCX of 7.5 volts and an internal regulated voltage VCCR of 5 volts, the duration of the time, T0', from the pull down enable signal becoming a logic high level to the voltage at the output node 26 becoming 0.4 volts, was 9.93 nanoseconds for the output driver circuit 20. For the prior art output driver circuit 10, the duration of this time interval, T0, was 10.37 nanoseconds. These results may depend on the type of simulation run.

A decrease in the supply voltage VCCX causes a corresponding decrease in the regulated supply voltage VCCR, and as the supply voltage VCCR decreases, the voltages at nodes 55 and 56 also decrease for output driver circuit 20. For example, it is assumed that the supply voltage VCCX decreases to 5 volts, causing the regulated supply voltage to decrease to about 3.6 volts. For this condition, when transistor 54 is enabled in response to the pull down signal being provided at the pull down node 24, the voltage that is provided at node 55 disables NOR gate 60, but the voltage that is provided at node 56 enables NOR gate 62. When enabled, NOR gate 62 passes the pull down signal to the gate electrode of transistor 46, causing transistor 46 to turn on. Thus, for the condition that the internal regulated supply voltage VCCR is at a level of 3.6 volts, transistors 32 and 46 are enabled and cooperate to pull the output node 26 to ground when the pull down signal is provided more quickly than transistor 32 is able to do alone.

Figure 4:
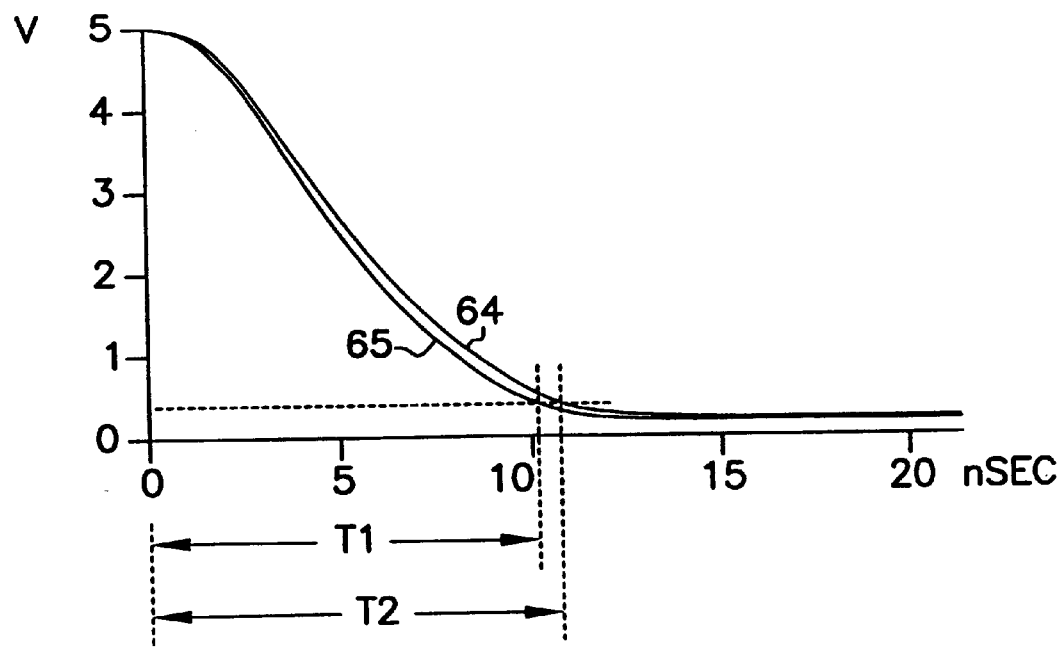
FIG. 4 illustrates the results of a computer simulation comparing the response of the prior art output driver circuit of FIG. 1 with the output driver circuit of FIG. 2 for a supply voltage of 5 volts.

FIG. 4 illustrates the results of a computer simulation comparing the response of the prior art output driver circuit 10 of FIG. 1 with the output driver circuit 20 of FIG. 2 for a supply voltage of 5 volts. FIG. 4 includes a curve 64, representing the voltage at the output node 16 of output driver circuit 10 as a function of time, and a curve 65, representing the voltage at the output node 26 of output driver circuit 20 as a function of time. Initially, the voltage at nodes 16 and 26 is assumed to be at the level of the supply voltage VCCX which is 5 volts. For the conditions of a supply voltage VCCX of 5 volts and a reference supply voltage VCCR of 3.6 volts, the duration of the time interval T1 from the pull down enable signal becoming a logic high level to the voltage at the output node 26 decreasing to about 0.4 volts. was 10.10 nanoseconds for the output driver circuit 20. For the prior art output driver circuit 10, the duration of the corresponding time interval T2 was 10.60 nanoseconds.

Assuming now that the supply voltage VCCX decreases to 2.5 volts and that the regulated supply voltage VCCR decreases to 2.5 volts. When the pull down signal is provided at the pull down node 24, transistor 54 is enabled so that the voltages at nodes 55 and 56 correspond to logic low levels which cause both NOR gates 60 and 62 to be enabled. Consequently, the pull down signal is gated to the gates of both transistors 44 and 46, so that both transistors 44 and 46 are turned on.

Figure 5:
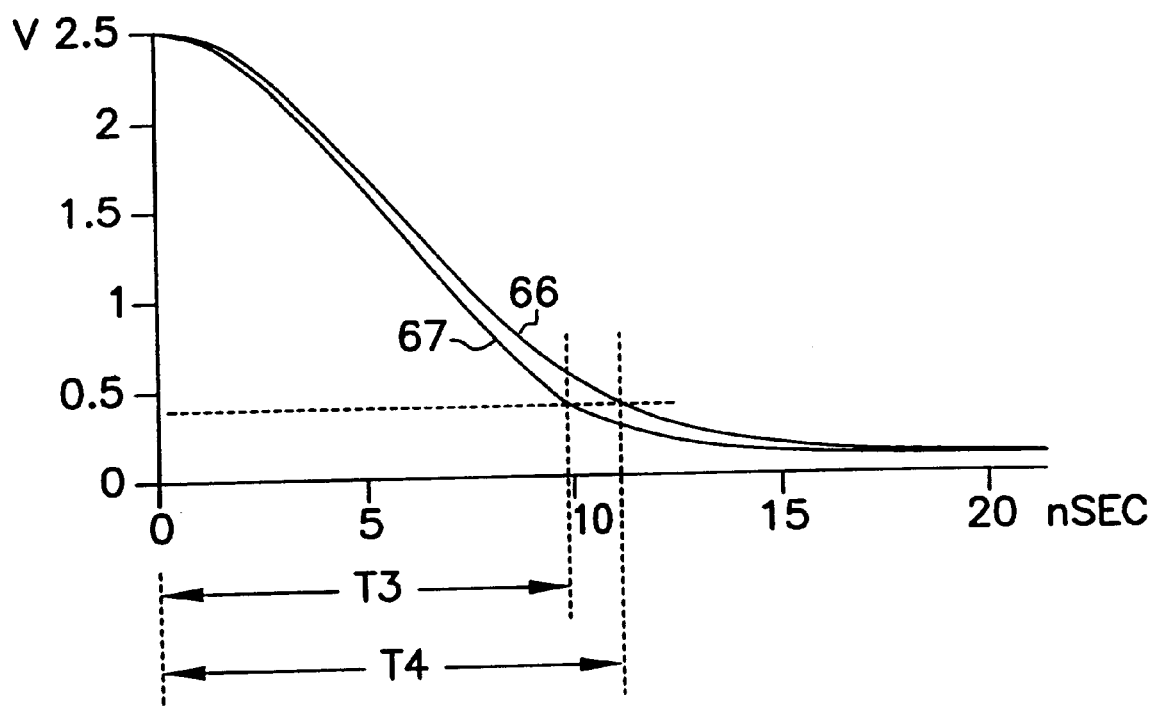
FIG. 5 illustrates the results of a computer simulation comparing the response of the prior art output driver circuit of FIG. 1 with the output driver circuit of FIG. 2 for a supply voltage of 2.5 volts.

FIG. 5 illustrates the results of a computer simulation comparing the response of the prior art output driver circuit 10 of FIG. 1 with the output driver circuit 20 of FIG. 2 for a supply voltage of 2.5 volts. FIG. 5 includes a curve 66, representing the voltage at the output node 16 of output driver circuit 10 as a function of time, and a curve 67, representing the voltage at the output node 26 of output driver circuit 20 as a function of time. Initially, the voltage at nodes 16 and 26 is assumed to be at the level of the supply voltage VCCX which is 2.5 volts. For the conditions of a supply voltage VCCX of 2.5 volts and a regulated supply voltage VCCR of 2.5 volts, the duration of the time interval T3 from the pull down enable signal becoming a logic high level to the voltage at the output node 26 becoming 0.4 volts, was 9.93 nanoseconds for the output driver circuit 20. For the prior art output driver circuit 10, the duration of the corresponding time interval T4 was 11.12 nanoseconds.

As can be seen from the examples, for the output driver circuit provided by the invention, as the level of the supply voltage VCCX, and thus the level of the regulated supply voltage VCCR, decreases, more pull down transistors are turned on. By comparing the results of the three computer simulations, it is seen that the maximum deviation or change in the time interval required to pull the output node 26 to 0.4 volts occurred when the supply voltage VCCX was at a level of 5 volts as compared to the levels of 7.5 volts or 2.5 volts for voltage VCCX. For these conditions, the deviation in the time intervals T1–T0 for the output driver circuit 20 was 10.10 ns–9.93 ns, or 0.17 nanoseconds. For the prior art output driver circuit 10, which does not include the voltage compensating circuit, the maximum deviation or change occurred in the time intervals T4–T0 (VCCX=2.5 volts, VCCX =7.5 volts) was 11.12 ns–10.37 ns 0.75, or about 4.4 times greater than that for the output driver circuit provided by the invention. Thus, the output driver circuit provided by the invention provides a more uniform pull down speed for different levels of the supply voltage. Moreover, because the ground bounce effect is less at a lower supply voltage, the output pull down driver can turn on harder for better speed without the penalty of ground bounce. While in the exemplary embodiment, the output driver circuit includes three pull down transistors, the output driver circuit can include more than three pull down driver transistors for improving output speed characteristics. One need simply provide more reference voltages via reference voltage source 40 by including more series-connected resistors and NOR gates to turn them on at desired voltage levels.

It may be beneficial to add some amount of hysteresis to the NOR gates 60 and 62 in order to ensure that they do not change their outputs as inputs drift about the trip points. Consequently, the pull down transistors 44 and 46 are maintained conducting until the inputs of the NOR gates drift significantly from the trip point voltages.

Figure 6:
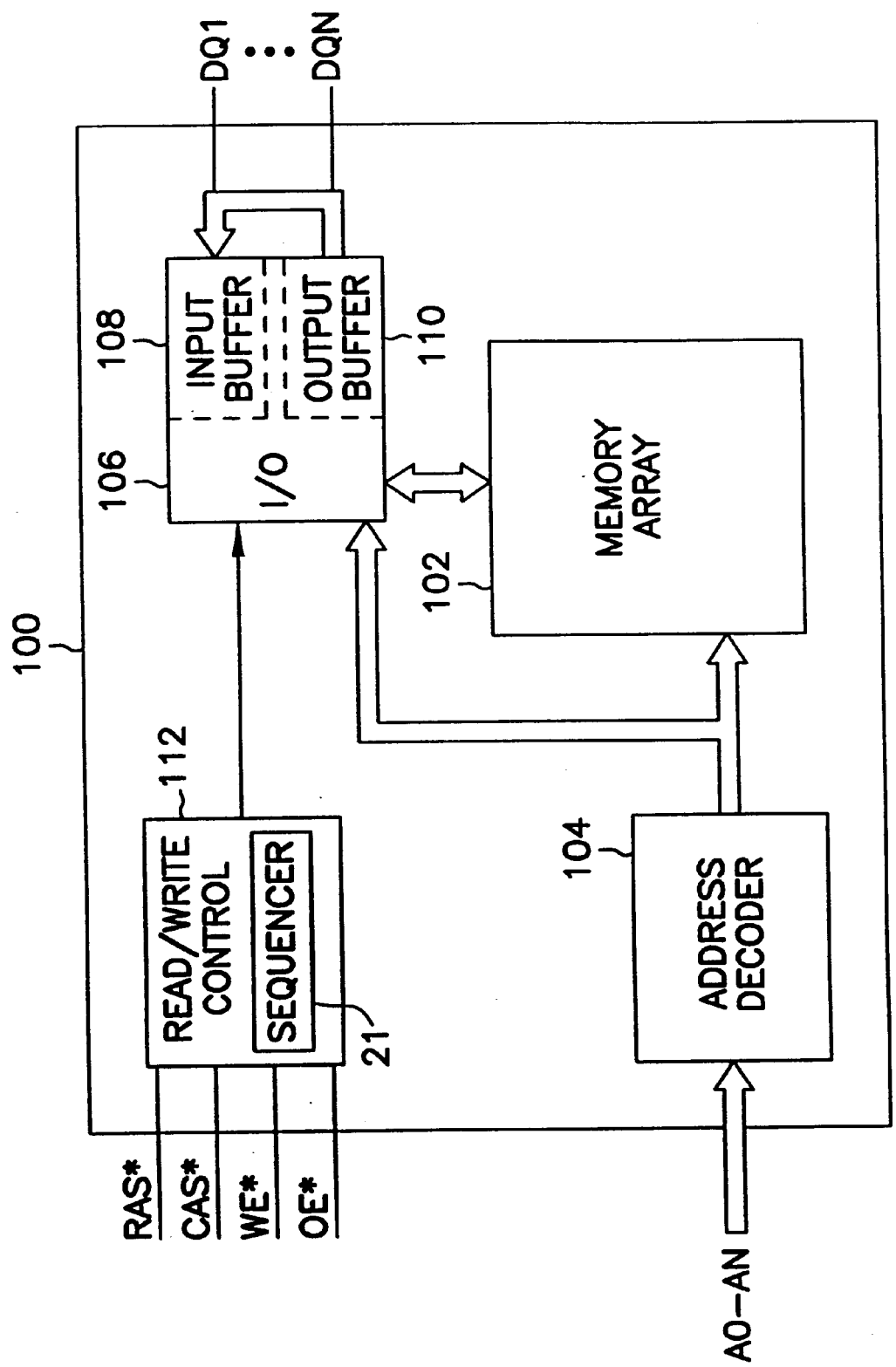
FIG. 6 is a block diagram of a dynamic random access memory incorporating the output driver circuit provided by the invention.

FIG. 6 is a simplified block diagram of a dynamic random access memory device (RAM) 100 incorporating the output driver circuit of the present invention. The DRAM device 100 includes a memory array 102 including a plurality of memory cells arranged in a plurality of rows and columns. An address decoder circuit 104 accesses the memory cells in response to address signals provided on the address inputs A0–AN. Input/output circuits 106, including a data input buffer 108 and a data output buffer 110 provide paths to enable the transfer of data between the input/outputs DQ1–DQN of the DRAM device 100 and the memory cells of the memory array 102 during write and read operations. The output driver circuit provided by the invention is incorporated into the data output buffer 110 for driving the data outputs DQ1–DQN during read operations. A read/write control circuit 112 controls path selection in writing of data into the memory and in reading data from the memory. Data provided on the data input/outputs DQ1–DQN is written to the memory when a write enable signal WE* is low. Data is read from the memory and applied to the data input/outputs DQ1–DQN when the write enable signal WE* is high and an output enable signal OE* is low.

Thus, it has been shown that the present invention provides an output driver circuit that compensates for variations in supply voltage to provide more consistent switching speed characteristics. In one embodiment, the output driver circuit includes a plurality of pull down devices which are connected in parallel with one another between an output node of the circuit and ground. One of the pull down devices is coupled to a source of a pull down signal to be turned on in response to the pull down signal. The other pull down devices are turned on selectively, depending upon the level of the supply voltage. The lower the supply voltage, the more pull down devices that are turned on. The result of this selective enabling of the pull down devices is that a more uniform pull down speed is provided for different levels of the supply voltage. It should be noted that the same concept is easily applied to pull up devices. In such an embodiment, pull up node 22 is coupled to NOR gates whose other inputs are coupled to a similar resistive divider. The nor gates drive further pull up transistors coupled to the supply voltage to assist pull up transistor 30 similar to the manner in which they are currently shown driving pull down transistors 44 and 46.

What is claimed is:

1. An output driver circuit having a supply voltage, comprising:
a pull up device responsive to a pull up signal for coupling an output node to a first voltage;
a first pull down device responsive to a pull down signal for coupling the output node to a second voltage;
a second pull down device responsive to the pull down signal for coupling the output node to the second voltage when the supply voltage is less than a predetermined value.

2. The output driver circuit of claim 1, where the second pull down device is coupled in parallel with the first pull down device.

3. The output driver circuit of claim 1, wherein both of the gull down devices couple the output node to the second voltage when the supply voltage is less than the predetermined value.

4. The output driver circuit of claim 1, further comprising a source of a reference voltage for setting the predetermined value of the supply voltage.

5. The output driver circuit of claim 4, where the reference voltage is less than the first value of the supply voltage.

6. The output driver circuit of claim 1, wherein the reference-voltage source includes a voltage divider.

7. An output driver circuit having a supply voltage, comprising:
   a pull up device responsive to a pull up signal for coupling an output node to a first voltage;
   a first pull down device responsive to a pull down signal for coupling the output node to a second voltage;
   a second pull down device responsive to a pull down signal for coupling the output node to the second voltage when the supply voltage is less than a first predetermined value;
   a third pull down device responsive to a pull down signal for coupling the output node to the second voltage when the supply voltage is less than a second predetermined value.

8. The output driver circuit of claim 7, where all of the pull down devices are coupled in parallel with each other.

9. The output driver circuit of claim 7, wherein both the first and second pull down devices couple the output node to the second voltage when the supply voltage is less than the first predetermined value.

10. The output driver circuit of claim 9, wherein all of the pull down devices couple the output node to the second voltage when the supply voltage is less than the second predetermined value.

11. The output driver circuit of claim 7, further comprising a source of a reference voltage for setting the predetermined first and second values of the supply voltage.

12. A semiconductor memory device having a supply voltage, comprising:
   a memory array;
   memory access circuitry for accessing the memory array during memory write operations and memory read operations, the memory access circuitry including an output driver circuit comprising:
      a pull up device responsive to a pull up signal for coupling an output node to a first voltage;
      a first pull down device responsive to a pull down signal for coupling the output node to a second voltage;
      a second pull down device responsive to the pull down signal for coupling the output node to the second voltage as a function of the supply voltage.

13. The semiconductor memory device of claim 12, wherein the first and second pull down devices are coupled in parallel between the output node and the second voltage.

14. The semiconductor memory device of claim 12, further comprising a third pull down device responsive to the pull down signal for coupling the output node to the second voltage as a further function of the supply voltage.

15. A method for switching a single output node between a first and a second voltage relative to a supply voltage, comprising:
   receiving one of a pull up signal and a pull down signal;
   coupling the output node to the first voltage in response to the pull up signal;
   determining the value of the supply voltage;
   coupling the output node to the second voltage through a first device in response to the pull down signal when the supply voltage has a first value;
   coupling the output node to the second voltage through a second device in response to the pull down signal when the supply voltage has a second value.

16. The method of claim 15, where the first device couples the output node to the second voltage when the supply voltage has the first value as well.

17. The method of claim 15, where the second value is lower than the first value.

18. The method of claim 15, where determining the value of the supply voltage comprises comparing it to a reference voltage.

19. The method of claim 18, where the first value is greater than a value determined by the reference voltage.

20. The method of claim 15, where the second value is less than a value determined by the reference voltage.

21. The method of claim 15, further comprising coupling the output node to the second voltage through a third device in response to the pull down signal when the supply voltage has a third value.

22. The method of claim 21, where the third value is lower than the second value.

* * * * *

UNITED STATES PATENT AND TRADEMARK OFFICE
CERTIFICATE OF CORRECTION

PATENT NO.: 5,940,320

DATED: Aug. 17, 1999

INVENTOR(S): Casper et al.

It is certified that errors appear in the above-identified patent and that said Patent is hereby corrected as shown below:

In column 1, line 40 delete the paragraph indentation before the paragraph beginning with "While".

In column 6, line 62 delete "gull" and insert --pull--, therefor.

Signed and Sealed this

Ninth Day of May, 2000

Attest:

Q. TODD DICKINSON

*Attesting Officer*     *Director of Patents and Trademarks*